United States Patent [19]

Garrett

[11] 3,725,753

[45] Apr. 3, 1973

[54] INVERSE GATE SEMICONDUCTOR CONTROLLED RECTIFIER

[75] Inventor: John Mansell Garrett, London, England

[73] Assignee: Westinghouse Brake English Electric Semi-Conductors Limited, London, England

[22] Filed: Apr. 14, 1972

[21] Appl. No.: 244,310

Related U.S. Application Data

[63] Continuation of Ser. No. 40,792, May 27, 1970, abandoned.

[30] Foreign Application Priority Data

June 11, 1969 Great Britain....................29,713/69

[52] U.S. Cl...........317/235 R, 307/305, 317/235 AB

[51] Int. Cl................................................H01l 11/10

[58] Field of Search ................................317/235 AB

[56] References Cited

UNITED STATES PATENTS 3,476,989 11/1969 Miles et al...........................317/235

3,531,697 9/1970 Muller et al.........................317/235

*Primary Examiner*—Jerry D. Craig

*Attorney*—Larson, Taylor & Hinds

[57] ABSTRACT

An inverse gate semiconductor controlled rectifier device including a base region, and main and auxiliary emitter regions respectively forming a main and auxiliary PN junction with the said base region is provided with a conductive layer located on the surface of the base region in ohmic contact therewith and extending from adjacent the auxiliary emitter junction to alongside an edge of the main emitter junction but not of itself bridging either the main or auxiliary junction. The conductive layer, in operation, expands a preferential current path between the auxiliary emitter and main emitter along the said edge.

17 Claims, 6 Drawing Figures

INVERSE GATE SEMICONDUCTOR CONTROLLED RECTIFIER

Figure 1:
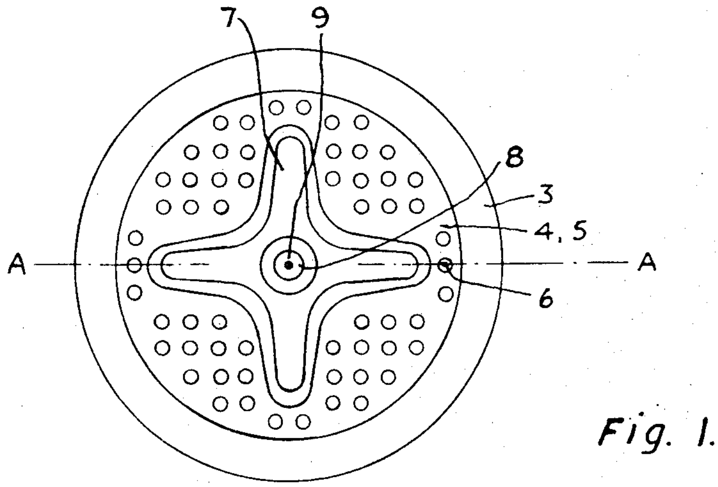

This is a continuation, division, of application Ser. No. 40,792 filed May 27, 1970 now abandoned.

This invention relates to semiconductor devices and particularly to semiconductor controlled rectifiers.

Such rectifiers usually consist of four regions of semiconductor material of alternate conductivity type forming three PN junctions. It is known to bring such a rectifier into the conducting (turned-on) state by applying a control signal between one main current-carrying electrode (the cathode) on a main emitter region and an auxiliary electrode (an auxiliary cathode) on an auxiliary emitter region. The auxiliary emitter region is usually a fifth region of semiconductor material adjacent the main emitter region and forming a PN junction to the same region of the semiconductor controlled rectifier as the main emitter region does. When the device is adapted to respond to a control signal so-polarized as to forward bias the auxiliary emitter junction and reverse bias the main emitter junction it is called an inverse gate device. When such a semiconductor controlled rectifier device is being turned-on the auxiliary emitter junction turns on first and the turn-on then spreads to the main emitter junction. The rate of turn-on is dependent on the rate at which the turned-on front can be propagated to and along the main emitter junction. Hitherto, this turn-on has been localized initially, usually adjacent to the auxiliary emitter region, resulting in a high current density and a relatively long propagation time.

According to the invention there is provided an inverse gate semiconductor controlled rectifier device including main and auxiliary emitter regions, each emitter region forming a PN junction with the same region, the base region, of the device, and a conductive zone in ohmic contact with a surface of said base region adjacent to the junction between said main emitter region and said base region, but not of itself bridging either emitter junction, which zone extends along an edge of said main emitter region and, in operation, spreads a current path between the auxiliary and main emitter along said edge.

The geometry of the device may be such that an increased amount of the main emitter junction is at a given current path length through the base region from the auxiliary emitter by virtue of the shunt through the conductive zone. The main emitter region may completely surround the auxiliary emitter region, both emitter regions being formed on the surface of the base region, and the conductive zone may cover substantially the whole of the surface of the base region between said emitters while being substantially isolated from them.

The conductive zone may have two portions one between the main and auxiliary emitters and the other portion surrounding the main emitter.

The main emitter junction may be at least partially short circuited. The partial short circuit may be formed by a conductive body extending from an ohmic contact to the main emitter region through an aperture in the main emitter region and the main emitter junction to an ohmic contact to the base region. The main emitter may be short circuited across the main emitter junction to the base region at an edge of the main emitter region, the short circuit being a localized ohmically resistive path. There may be a plurality of such localized paths distributed along an edge of the main emitter region.

When the conductive zone is in two or more portions these may be joined by external electrical conductors.

The device may include a further PN junction in a conductive path between the electrode of the auxiliary emitter and the conductive zone, said junction being so-polarized as to become forward biased by a potential difference between the conductive zone and the auxiliary emitter which would reverse bias the junction between the auxiliary emitter and the base region.

The further PN junction may be formed by a diode pellet mounted on the conductive zone and connected to the auxiliary emitter electrode. The conductive zone or zones and the main emitter region may be annulii centered on the auxiliary emitter region, the conductive zone or zones and the emitter regions all being formed on one face of a body of semiconducting material.

The main emitter junction apart from the peripheral portion may be partially short circuited by apertures in the emitter region through which the emitter electrode can make contact with the base region.

The control signal to turn-on the device may be generated in a control signal generator by-passed by a diode and connected between the auxiliary and main emitter electrodes through a series resistor.

Figure 1A:
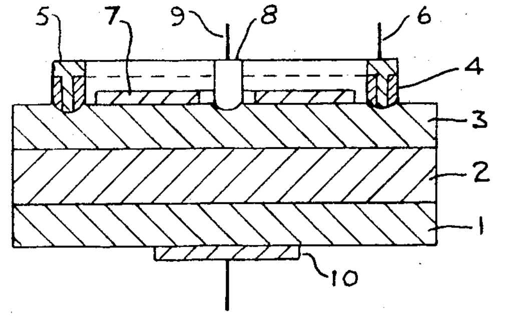
Figure 2:
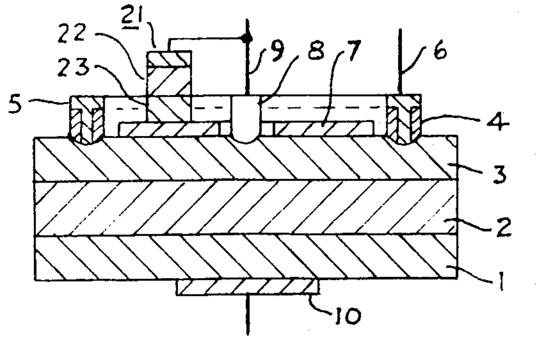
Figure 3A:
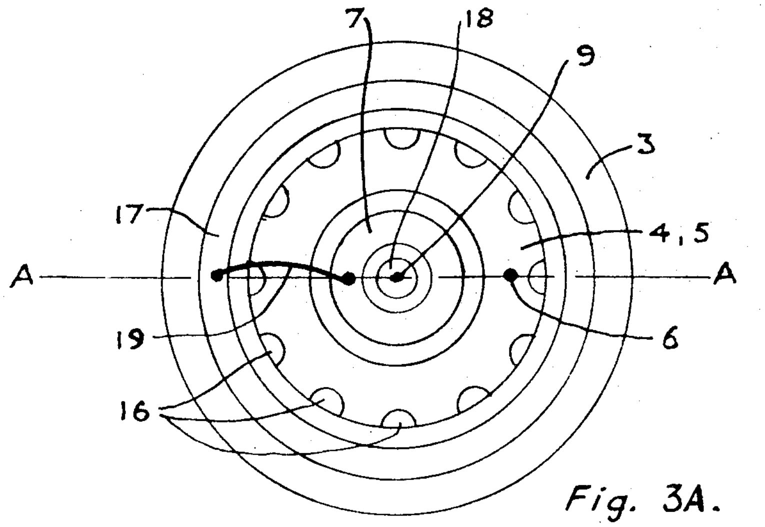
Figure 3B:
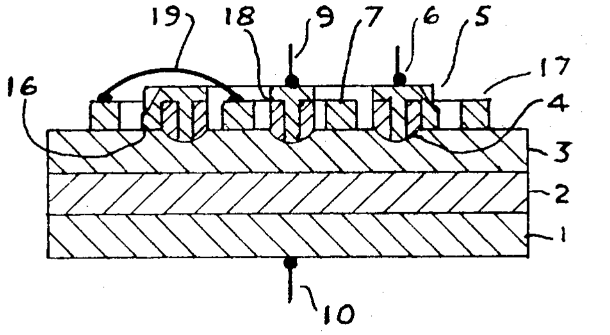
Figure 4:
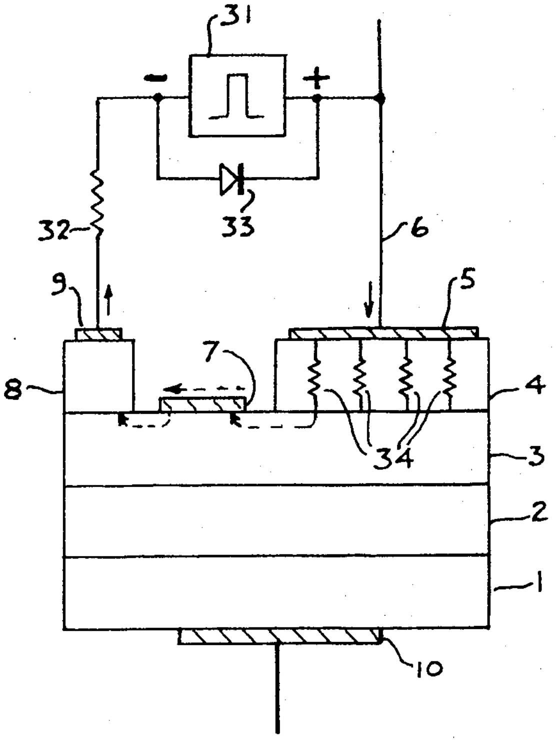

Embodiments of the invention will now be described with reference to the accompanying drawings in which:

FIGS. 1 and 1A show a plan and cross-sectional elevation of a semiconductor controlled rectifier device, FIG. 2 shows the device of FIG. 1 together with a further diode, FIGS. 3A and 3B shows a further device in plan and elevation, and FIG. 4 shows a circuit arrangement for the operation of the device shown in FIG. 1 or FIG. 2 or FIG. 3.

Referring firstly to FIG. 1 this shows a plan view of a semiconductor device according to the invention while FIG. 1A shows a cross-sectional elevation along the line AA in FIG. 1. The regions referenced 1, 2 and 3 in FIG. 1A are respectively layers of p,n,p conductivity type material with PN junctions formed between them. A fourth region, 4, is of N-conductivity type material and forms a PN junction with region 3. An ohmic contact 10 is made to region 1 and an ohmic contact 5 to region 4 to form the anode and cathode respectively of a semiconductor controlled rectifier. In a preferred embodiment of the invention the cathode contact 5 and the fourth or main emitter region 4 are formed in the manner described in our United Kingdom British Pat. specification No. 1049417. The junction between region 4, the emitter, and region 3, the base, must in any case in operation be at least partially short circuited having regard to the features mentioned below. As will be seen from FIG. 1 regions 4 and 5 are superimposed and in the form of a disc having a central aperture in the shape of a cross. At the center of the disc a fifth region 8 of N-conductivity type material is provided to form a PN junction with the base region 3. An ohmic contact, not shown, is made to region 8 and connecting leads 9 and 6 are connected to the ohmic contacts associated with N-type regions 8 and 4 respectively. A conductive zone, 7, is formed on the surface of the base region 3 in the space between the main emitter region 4 and the auxiliary emitter region 8. This conductive zone 7 extends close to the periphery of the junction between each emitter region and the base but must on no account bridge the junction to provide an ohmic short circuit. The spacing between the zone and the junction is preferably some 0.015 inch. The resistivity of the conductive zone 7 must be lower than the resistivity of the semiconductor material forming region 3.

The operation of the device described above will now be considered. It is well known in the art to use an auxiliary emitter to turn-on a main emitter. The region of initial breakover is however limited to that part of the main emitter junction close to the auxiliary emitter that is, where the auxiliary emitter current flow on breakover can influence the main junction. This produces high local current densities and increased propagation times. To mitigate these limitations it is proposed to increase the length of the main emitter junction influenced by the auxiliary emitter. It is also desirable to increase the length of main emitter junction available in a given device size. If the auxiliary emitter is merely increased in area, the increase in main junction breakover length is not great, being proportional only to the square root of the increase for circular concentric emitters (the usual configuration for these devices.) Accordingly, one or more re-entrants are formed in the main emitter junction periphery facing the auxiliary emitter, as shown in FIG. 1. This results in large differences in the resistance of the path between the auxiliary and main emitters, depending on the radial direction of the path, which causes current bunching resulting in a performance little better than before. Attempts to extend the auxiliary emitter itself by conductive zones are also unsatisfactory, as the conductive zones by-pass the auxiliary emitter junction making initial breakover more difficult and increasing the control signal required. However, by providing a conductive zone, 7, shows peripheries are substantially equi-distant from the main emitter on the one hand and the auxiliary emitter on the other, and isolated from them, the radial path resistances are equalized. The path resistance now has three components viz: the resistance of the auxiliary junction and the base region portion to the conductive zone; the conductive zone itself; and the base region portion between the conductive zone and the main emitter junction. The conductive zone resistance is small compared with the other components and a substantially constant total value is thus obtained regardless of the change in value of e conductive zone resistance with radial direction. The current flow across the main emitter junction on the breakover of the auxiliary junction is thus distributed evenly along the greatly elongated main emitter periphery, improving the breakover performance of this junction without imparing the breakover performance of the auxiliary emitter junction. The degree of convolution of the main emitter junction and the conductive zone edge adjacent to it can be varied, for example a larger number of smaller re-entrants could be formed in the main emitter periphery.

A further embodiment of the invention is shown in FIGS. 3A and 3B and this has the advantage that it is circularly symmetrical so that any contact electrodes applied to the device need only be aligned axially with the device and no account has to be taken of rotation of the device with respect to the electrodes when mounting. Referring now to FIGS. 3A and 3B, in which similar regions to those in FIG. 1 are similarly numbered, a plan and sectional elevation along the line AA on the plan of a semiconductor controlled rectifier device are shown. The regions referenced 1, 2 and 3 are respectively layers of P, N, P conductivity type material with PN junctions formed between them. A fourth, annular, region 4 is of N-conductivity type material and forms a PN junction with region 3. An ohmic contact 10 is made to the region 1 and an ohmic contact 5 to region 4 to form the anode and cathode respectively of a semi-conductor controlled rectifier. A cathode contact and emitter region may be formed in the same manner as in of FIG. 1. At the center of the annulus 4 a fifth region 18 of N-conductivity type material is provided to form a PN junction with the base region 3. This region may also be formed as a "shorted" emitter in the same manner as the annular region 4. A conductive zone in two parts 7 and 17 is formed on the surface of the base region 3. Part 7 is on the surface in the space between the annulus 4 and the auxiliary emitter 18 while the part 17 is an annulus surrounding the annulus 4. The constructional details given for FIG. 1 apply to the conductive zones in this embodiment also. The two parts of the conductive zone are joined by an electrical conductor 19 which is electrically isolated from the main emitter where it crosses it. It has been found desirable in certain circumstances to short circuit part of the main emitter outer periphery, that part adjacent to the annulus 17, to the base region 3. To this end portions 16 of the annulus 4 are omitted so that when the contact 5 is applied, for example by plating, the edge of the emitter region includes localized short circuits formed by the contact material ohmically connecting the emitter region to the base. With the arrangement just described there is no need for more than three electrodes for the device. If however four electrodes are acceptable or even desirable the localized short circuits 16 can be omitted and an external resistor connected to perform the same function. A suitable value for this resistor would lie between 1 ohm and 20 ohms for devices with current ratings of 50 to 500 amps. It has been found desirable that the short circuits in the form of the localized paths 16 are distributed around the edge of the main emitter. A diode may be incorporated in the device in FIG. 3 in the same manner as the diode is incorporated in the device shown in FIG. 2 (below). If required the auxiliary emitter 18 can be displaced from the center of the device to one side of part 7 of the conductive region to make room for the mounting of the diode.

Alternatively if a fourth terminal is brought out of the device which is connected to the conductive zone then the diode may be connected externally to the device to produce the same electrical result.

The operation of the device in FIGS. 3A and 3B is as described above for the device of FIG. 1.

Reference is now made to FIG. 4 which shows one arrangement for operating an inverse gate device embodying the invention. This figures shows a diagrammatic version of the device shown in FIG. 1. A control signal generator 31, shunted by a diode 33, can generate a control signal of the polarity shown which is supplied to the main and auxiliary cathodes, 6 and 9 respectively through a series current limiting resistor 32. The voltage to be controlled by the device is applied across the anode 10 and the main cathode 6 with the anode more positive than the main cathode. Control signal current from the generator 31 flows along the lead to the cathode 6 through the distributed localized emitter shorts circuits 34 to the base region 3. The current then flows laterally through the base region 3 towards the auxiliary emitter 8. The conductive zone 7 provides a preferential path to the semiconductor material of the base region where the zone is present on the surface of the region and the current therefore flows through this zone to by-pass part of the base region. The current passes through the control signal generator through a series current-limiting resistor 32. The passage of the current from the base 3 to the auxiliary emitter 8 causes the injection of electrons into the base region which electrons cause the breakover of the PN junction between the regions 2 and 3 to switch on the device to the passage of current between the anode 10 and the auxiliary cathode 9. The current flowing from anode 10 to auxiliary cathode 9 passes through resistor 32 and the shunt diode 33, by-passing the control signal generator 31, to reach the lead the main cathode 6. The switching-on of the device between anode 10 and auxiliary emitter 8 permits the auxiliary emitter potential to tend towards that of the anode. This reverses and increases the potential difference between the auxiliary and main emitters and causes the main emitter to inject a heavy concentration of electrons along the edge nearest to the conductive zone by biasing the auxiliary emitter positive with respect to the main emitter.

When the device is only switched on between the anode 10 and the auxiliary emitter 8 the current passing through the resistors 32 tends to bias the main cathode negative with respect to the auxiliary cathode. When this bias becomes a significant proportion of the voltage applied between and anode and the main cathode than in addition to its function of increasing injection from the main emitter region it also tends to remove holes from the nearby base region. This removal of holes tends to suppress injection by the auxiliary emitter and oppose the improvement in injection by trying to turn off the device. Undesirably low resistance values of resistor 32 may be required at low anode to main cathode voltages to prevent this effect. Accordingly it is proposed to include a diode, 21 in FIG. 2, between the auxiliary cathode and the conductive zone 7. This diode is so polarized that the conductive zone cannot become more negative with respect to the auxiliary cathode than the forward voltage drop of the diode itself. In the embodiment illustrated in FIG. 2 region 22 is of P-conductivity type material and region 23 of N-conductivity type material. In the embodiment illustrated in FIG. 1 a preferred method of applying the diode is to attach a "pellet" type diode to one of the arms of the conductive zone 7 and to connect the diode to the auxiliary cathode 9. This provides a simple and economical solution to this limitation of performance of the device at one end of its range by ensuring that the potential difference which increases the injection of the main emitter region is only applied where it is more useful, that is, between the conductive zone and the adjacent edge of the main emitter itself.

I claim:

1. An inverse gate semiconductor controlled rectifier device comprising a body of semiconductor material including a first region of one conductivity type, a second region of the other conductivity type, a first PN junction formed between said first and second regions, a third, base region of said one conductivity type, a second PN junction formed between said second and third regions, a fourth, main emitter region of said other conductivity type, a third PN junction formed between said base region and said main emitter region, a fifth, auxiliary emitter region of said other conductivity type and a fourth PN junction formed between said base region and said auxiliary emitter region, a first, main current carrying terminal connected to said first region, a second, main current carrying terminal connected to said main emitter region, an auxiliary terminal connected to said auxiliary emitter region, the direct electrical paths between the fourth, auxiliary emitter, PN junction and the third, main emitter, PN junction having different resistance values, and said base region including a conductive zone for providing paths of equal resistance between all parts of the fourth, auxiliary emitter, PN junction and the third, main emitter, PN junction.

2. A device as claimed in claim 1 in which the main emitter region completely surrounds the auxiliary emitter region, both emitter regions being formed on said surface of the base region, and in which the conductive zone covers substantially the whole of the surface of the base region between said emitters while not being in ohmic electrical contact with them.

3. A device as claimed in claim 1 including a further conductive zone adjacent another path of the edge of the main emitter region, the two zones being ohmically connected.

4. A device as claimed in claim 3 in which the further conductive zone surrounds the periphery of the main emitter region.

5. A device as claimed in claim 1 in which the main emitter junction is at least partially short circuited.

6. A device as claimed in claim 1 in which the auxiliary emitter junction is at least partially short circuited.

7. A device as claimed in claim 5 in which the partial short circuit is formed by a conductive body extending from an ohmic contact with the emitter region through an aperture in the emitter region and the emitter junction to an ohmic contact with the base region.

8. A device as claimed in claim 5 in which the main emitter region is short circuited to the base region across the main emitter junction at an edge of the main emitter region.

9. A device as claimed in claim 8 in which said short circuit is formed by a plurality of symmetrically positioned ohmically resistive paths bridging said edge.

10. A device as claimed in claim 1 and including a discrete resistor connected between the main emitter and the conductive zone.

11. A device as claimed in claim 3 in which a wire connection joins the conductive zones.

12. A device as claimed in claim 1 and including a further PN junction in an operatively conductive path between the electrode of the auxiliary emitter and the conductive zone, said junction being so-polarized as to be forward biased in operation by a potential difference applied between the conductive zone and the auxiliary emitter to reverse bias the junction between the auxiliary emitter and the base region.

13. A device as claimed in claim 12 in which the further PN junction is formed by a diode pellet mounted on the conductive zone and connected to the auxiliary emitter electrode.

14. A device as claimed in claim 2 in which the conductive zone and the main emitter region are annulii centered on the auxiliary emitter region.

15. A device as claimed in claim 14 in which the conductive zone and the emitter regions are formed on one face of a body of semiconducting material.

16. A device as claimed claim 1 in which the main emitter junction apart from the peripheral portion is partially short circuited by means extending through apertures in the emitter region to make ohmic contact between an emitter electrode and the base region.

17. A circuit including a device as claimed in claim 1 and a control signal generator by-passed by a diode and connected between the auxiliary and main emitter electrodes of the device through a series resistor.

* * * * *